(12) United States Patent
Tomioka et al.

(10) Patent No.: US 7,510,911 B2
(45) Date of Patent: Mar. 31, 2009

(54) SEMICONDUCTOR APPARATUS AND METHOD OF MANUFACTURING THE SAME

(75) Inventors: Taizo Tomioka, Yokohama (JP); Kazuo Shimokawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 554 days.

(21) Appl. No.: 10/876,016

(22) Filed: Jun. 25, 2004

(65) Prior Publication Data
US 2005/0029651 A1 Feb. 10, 2005

(30) Foreign Application Priority Data
Jun. 26, 2003 (JP) ............................. 2003-182454
Jun. 24, 2004 (JP) ............................. 2004-186041

(51) Int. Cl.
*H01L 21/00* (2006.01)
*H01L 23/10* (2006.01)
*H01L 23/34* (2006.01)

(52) U.S. Cl. ..................... 438/122; 257/707
(58) Field of Classification Search ................ 257/777, 257/722, 98, 116, 660, 678, 679, 683, 687, 257/700, 707, 730, 778; 361/719; 165/80.4; 438/15, 25, 26, 51, 55, 64, 106, 108, 112, 438/122
See application file for complete search history.

(56) References Cited

U.S. PATENT DOCUMENTS

| | | | | |
|---|---|---|---|---|
| 4,649,990 A | * | 3/1987 | Kurihara et al. | ............ 165/80.4 |
| 5,055,914 A | * | 10/1991 | Shimizu et al. | ............. 257/722 |
| 5,586,006 A | * | 12/1996 | Seyama et al. | .............. 361/719 |
| 6,627,997 B1 | * | 9/2003 | Eguchi et al. | ............... 257/777 |

FOREIGN PATENT DOCUMENTS

| | | |
|---|---|---|
| JP | 5-73066 | 10/1993 |
| JP | 8-250652 | 9/1996 |
| JP | 2001-177010 | 6/2001 |

* cited by examiner

*Primary Examiner*—Davienne Monbleau
*Assistant Examiner*—Monica D Harrison
(74) *Attorney, Agent, or Firm*—Finnegan, Henderson, Farabow, Garrett & Dunner, L.L.P.

(57) ABSTRACT

A semiconductor device comprises a plurality of semiconductor chips each having a surface bonded to a wiring board and being electrically connected thereto, a plurality of metal plates each having a one-end portion bonded to the other surface of each of the plurality of semiconductor chips and having an other-end portion bonded to the wiring board to make electric connection therebetween, thermoplastic resin which seals the metal plates integrally as one body, such that a surface opposing the surface bonded to the semiconductor chip, of each of the metal plates, is exposed to outside, and thermosetting resin which seals an outer peripheral portion of the thermoplastic resin, and the semiconductor chips.

9 Claims, 7 Drawing Sheets

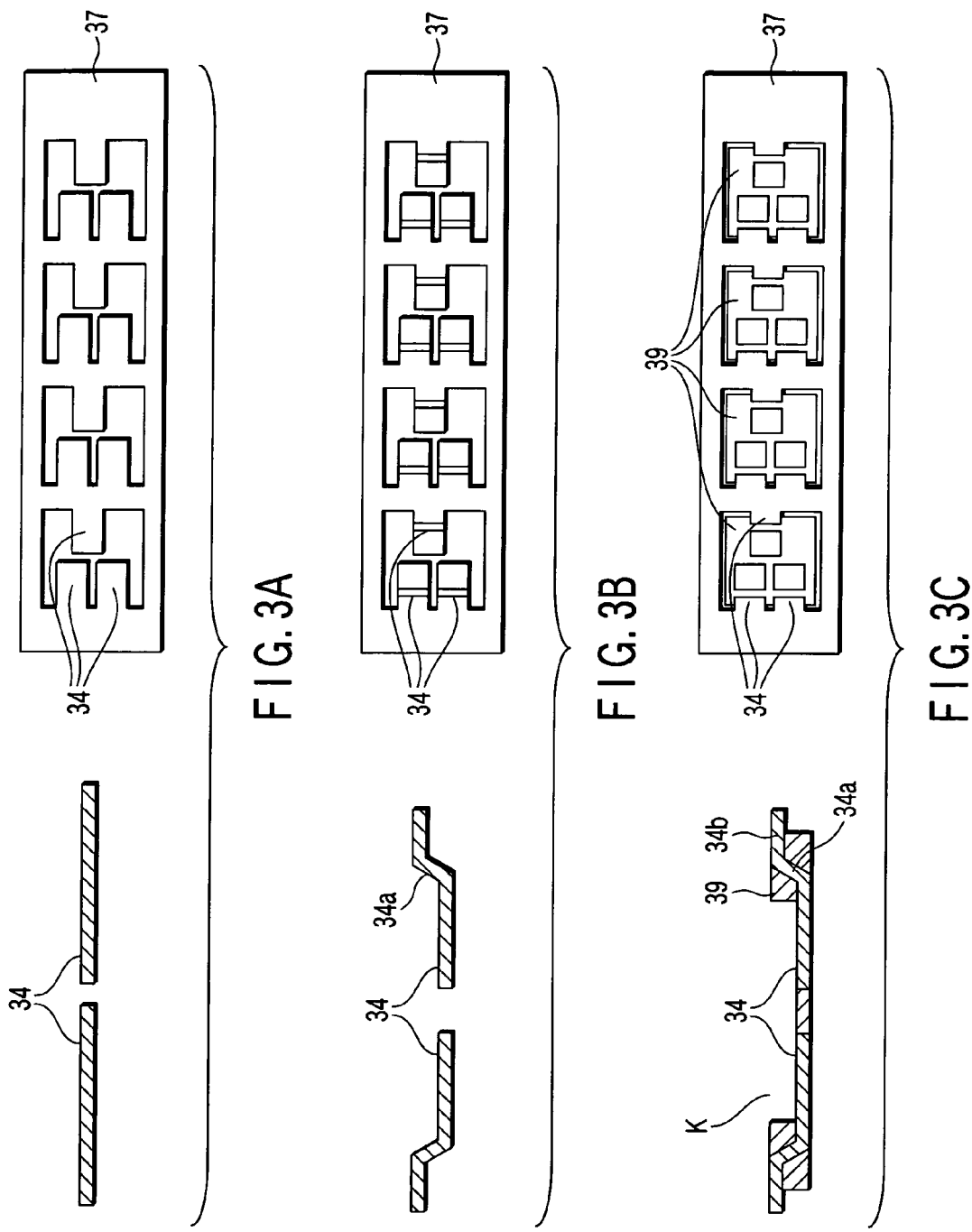

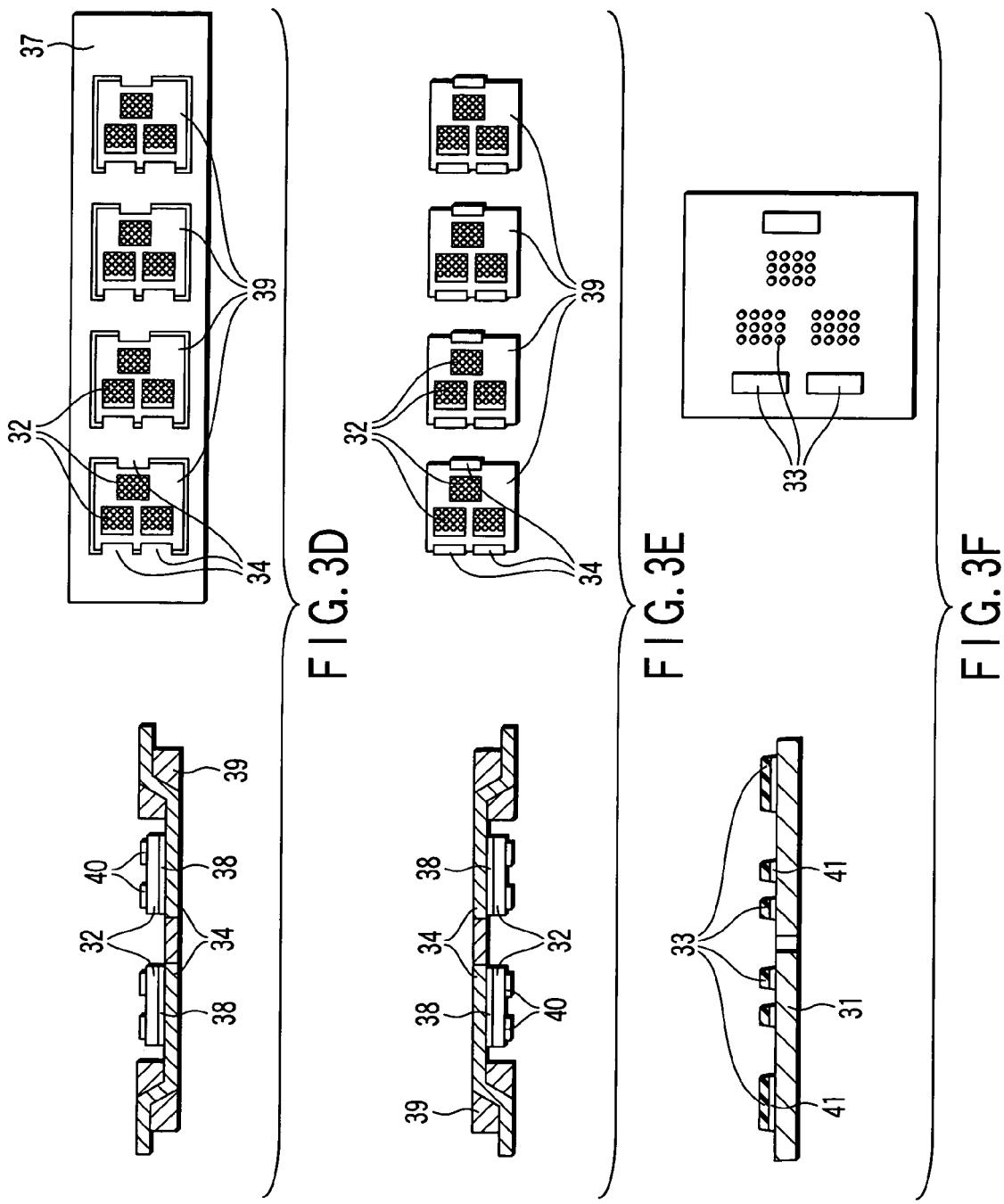

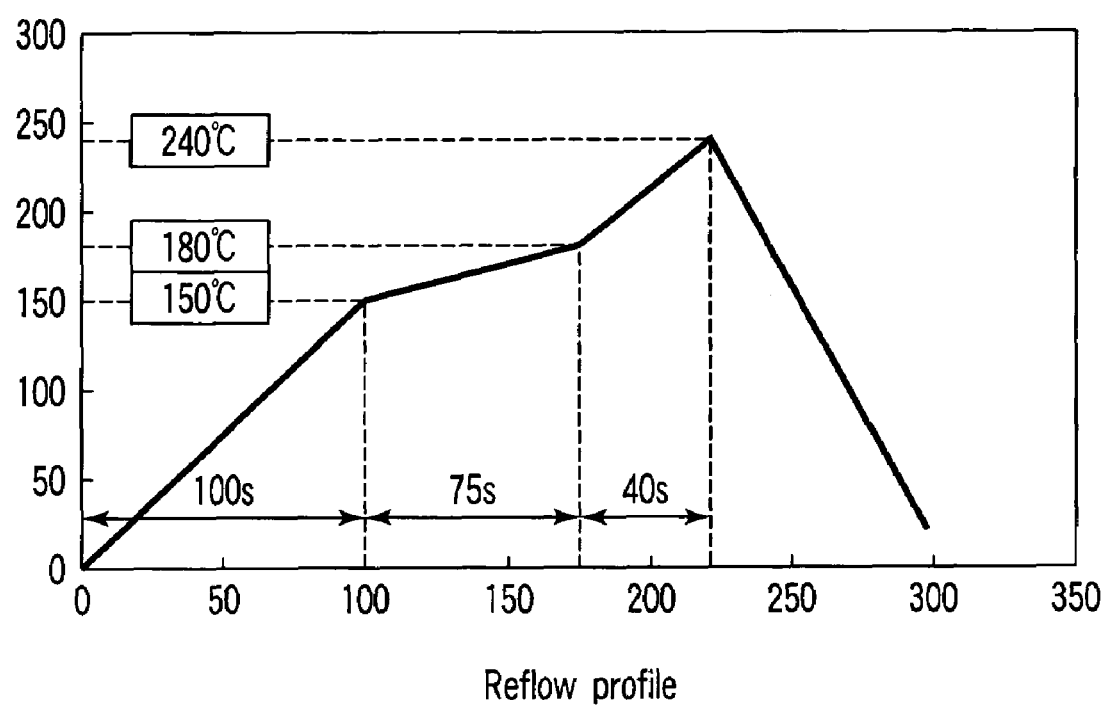
F I G. 4

SEMICONDUCTOR APPARATUS AND METHOD OF MANUFACTURING THE SAME

CROSS-REFERENCE TO RELATED APPLICATIONS

This application is based upon and claims the benefit of priority from prior Japanese Patent Applications No. 2003-182454, filed Jun. 26, 2003; and No. 2004-186041, filed Jun. 24, 2004, the entire contents of both of which are incorporated herein by reference.

BACKGROUND OF THE INVENTION

1. Field of the Invention

This invention relates to a semiconductor device having a semiconductor chip mounted on a circuit board by flip chip bonding and, more particularly, to a multi-device having a plurality of semiconductor chips mounted and a method of manufacturing the same.

2. Description of the Related Art

A semiconductor device shown in, for example, FIGS. 5 and 6 is known as this kind of semiconductor device.

FIG. 5 is a plan view showing the semiconductor device and FIG. 6 is a cross-sectional view of the semiconductor device as seen along a line C-C' of FIG. 5.

The semiconductor device comprises a wiring board 16. First to fourth semiconductor chips 17, 18, 19 and 20 are arranged on the wiring board 16. One-end portions of heat radiating members (hereinafter called metal plates) 21, 22, 23 and 24 are bonded to top surface portions of the first to fourth semiconductor chips 17 to 20, respectively, and the other-end portions thereof are bonded to the wiring board 16. The semiconductor chips 17 to 20 and the heat radiating members 21 to 24 are sealed by thermosetting resin 25.

The first and second semiconductor chips 17 and 18 are control ICs. The third and fourth semiconductor chips 19 and 20 are MOSFETs. Each of the third and fourth semiconductor chips (MOSFETs) 19 and 20 comprises a gate electrode and a source electrode on a top surface and a drain electrode on a back surface. The metal plates 23 and 24 connected to the third and fourth semiconductor chips (MOSFETs) 19 and 20 serve as passages through which heat generated by the semiconductor chips 19 and 20 are radiated to outside and play a role of electrically connecting the back surfaces of the semiconductor chips 19 and 20 to the wiring board 16.

The semiconductor chips 17 to 20 are connected to the wiring board 16 by flip chip bonding using high-melting-point solder 26. The metal plates 21 to 24 are bent in a shape of gull wing and connected to the back surfaces of the semiconductor chips 17 to 20, respectively, by low-melting-point solder 27 and to the wiring board 16 by the low-melting-point solder 27.

Use of the solders 26 and 27 having different melting points prevents the flip chip bonding portions of the semiconductor chips 17 to 20 from melting during the soldering of the metal plates 21 to 24.

The metal plates 21 to 24 may be bonded to the back surfaces of the semiconductor chips 17 to 20 and the wiring board 16 with conductive paste containing thermosetting resin. In this case, however, the heat radiation efficiency of the semiconductor chips 17 to 20 is lowered.

Moreover, to radiate heat of the semiconductor chips, radiation covers are provided on the flip chip semiconductor chips. In this example, each of metallic radiation covers is attached onto the semiconductor chip and comprises four feet.

As the assembling method, the semiconductor chips are first mounted on the wiring board by the flip chip bonding and then the radiation covers are provided on the semiconductor chips.

Materials having preferable thermal conductivity such as copper/molybdenum, copper/tungsten or the like are used for the radiation covers. The semiconductor chips and the radiation covers are bonded with a heat-conducting adhesive or solder. The feet of the radiation covers are bonded to the wiring board with an adhesive or solder.

If a large current flows to the semiconductor device having such a structure, a large quantity of heat is generated from the semiconductor chips. If the semiconductor device is applied to a power MOSFET having electrodes on the back surfaces of the semiconductor chips, solder needs to be employed for bonding of each of semiconductor chips as disclosed in the prior art. The semiconductor device is sealed with resin after the semiconductor chips and the radiation covers are mounted on the wiring board (see, for example, Jpn. Pat. Appln. KOKOKU Publication No. 5-73066).

In general, the semiconductor device is sealed with a kind of resin. A thermosetting epoxy resin is often used as this resin in view of manufacturing costs and the resistance to heat. The resin is supplied to the semiconductor device by transfer mold or printing (see, for example, Jpn. Pat. Appln. KOKAI Publication No. 2001-177010).

In the other structure of the semiconductor device, a flat plate is connected to the back surface of the device to radiate heat. A heat radiating portion can be secured but this structure cannot be applied to a MOSFET allowing electrodes to be taken from the back surface (see, for example, Jpn. Pat. Appln. KOKAI Publication No. 8-250652).

In the prior art, however, since the semiconductor chips and the metal plates are sealed with resin and then the resin on the metal plates is removed to expose the metal plates, load may be applied to the flip chip bonding portions of the semiconductor chips located under the metal plates and the flip chip bonding portions may be thereby damaged.

In addition, since a plurality of metal plates are attached separately to the wiring board, the angle of attachment of the metal plates becomes irregular and the degree of parallel becomes lower. Therefore, the resin can hardly be removed from the metal plates.

BRIEF SUMMARY OF THE INVENTION

The present invention has been accomplished to solve the above-described problems. The object of the present invention is to provide a semiconductor device capable of exposing heat radiating members without removing a sealing material and a method of manufacturing the same.

According to an aspect of the present invention, there is provided a semiconductor device comprising a plurality of semiconductor chips each having a surface bonded to a wiring board and being electrically connected thereto, a plurality of heat radiating members each having a one-end portion bonded to the other surface of each of the plurality of semiconductor chips and having an other-end portion bonded to the wiring board to make electric connection therebetween, a first sealing material which seals the plurality of heat radiating members integrally as one body, such that a surface opposing the surface bonded to the semiconductor chips, of each of the heat radiating members, is exposed to outside, and a second sealing material which seals an outer peripheral portion of the first sealing material, and the semiconductor chips.

According to another aspect of the present invention, there is provided a method of manufacturing a semiconductor device, comprising forming a cap by sealing a plurality of heat radiating members integrally as one body with a first sealing material, such that a one-end portion of each of the heat radiating members is exposed, mounting semiconductor chips on the one-end portions of the integral heat radiating members, bonding the mounted semiconductor chips and the other-end portions of the heat radiating members to a wiring board, and sealing the semiconductor chips bonded to the wiring board, and an outer peripheral portion of the first sealing material with a second sealing material.

According to the present invention, a semiconductor device having high accuracy of outer dimensions and high reliability can easily be manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is illustrations showing a manufacturing step of the semiconductor device of the present invention;

FIG. 3B is illustrations showing the manufacturing step of the semiconductor device of the present invention;

FIG. 3C is illustrations showing the manufacturing step of the semiconductor device of the present invention;

FIG. 3D is illustrations showing the manufacturing step of the semiconductor device of the present invention;

FIG. 3E is illustrations showing the manufacturing step of the semiconductor device of the present invention;

FIG. 3F is illustrations showing the manufacturing step of the semiconductor device of the present invention;

FIG. 4 is a graph showing a reflow profile of the manufacturing step;

DETAILED DESCRIPTION OF THE INVENTION

Embodiments of the present invention will be explained below with reference to the accompanying drawings.

Figure 1A:
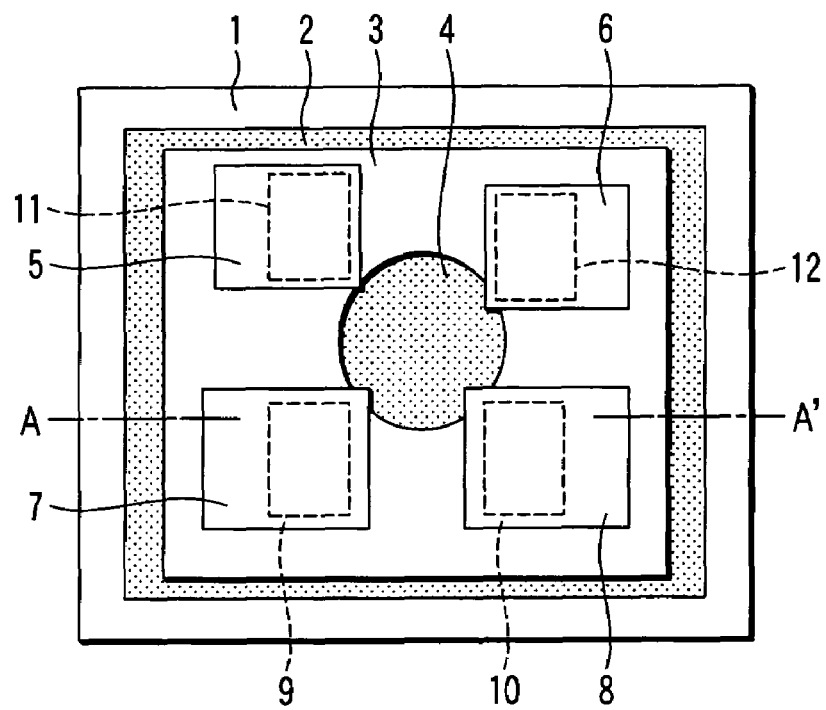
FIG. 1A is a plan view showing a semiconductor device according to a first embodiment of the present invention.
Figure 1B:
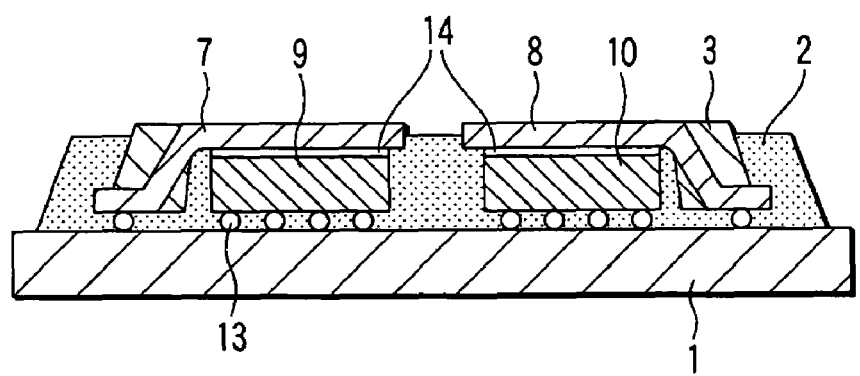
FIG. 1B is a cross-sectional view as seen along a line A-A' of FIG. 1A.

FIG. 1A is a plan view showing a semiconductor device according to a first embodiment of the present invention. FIG. 1B is a cross-sectional view as seen along a line A-A' of FIG. 1A.

The semiconductor device of FIGS. 1A and 1B comprises a wiring board 1 having a glass epoxy resin member as its base material, a plurality of semiconductor chips 9, 10, 11 and 12 which have a surface including electrodes and electric circuits arranged opposite the wiring formed on a surface of the wiring board 1 and which have the electrodes electrically connected to the wiring of the wiring board 1 by solder bumps 13, metal plates 5, 6, 7 and 8 which have a surface of the semiconductor chips 9, 10, 11 and 12 opposite to the surface where the electrodes and electric circuits are formed connected to the wiring of the wiring board 1 and which have step portions, solder 14 serving as a die bonding material, which connects the metal plates 5 to 8 to the back surfaces of the semiconductor chips 9 to 12, respectively, thermoplastic resin 3 molded and solidified to retain the metal plates 5 to 8 as one body by sealing inclined portions that form the step portions of the metal plates, and thermosetting rein 2 which seals side portions of the thermoplastic resin 3, metal plates 5 to 8, semiconductor chips 9 to 12, solder bumps 13 and solder 14.

The semiconductor chips 9 to 12 are two MOSFETs and two control ICs that control the MOSFETs, each of which is employed for a power device generating a large quantity of heat. Each of the MOSFETs has a source electrode and a gate electrode on a surface opposing the wiring board 1 and has a drain electrode formed on a back surface. Each of the control ICs has electrodes formed only on the surface opposing the wiring board 1. In other words, the semiconductor chips 9 to 12 are connected to the wiring board 1 in a state of flip chip.

The metal plates 5 to 8 are copper plates having a thickness of 120 µm and having a surface plated with nickel and gold that serve as barrier metals. The metal plates 5 to 8 electrically connect the wiring board 1 with the back surface of the semiconductor chips 9 to 12 and function as heat radiation plates that assist heat radiation of the semiconductor chips 9 to 12.

Each of the metal plates 5 to 8 is pressed to have parallel step portions via an inclined portion. The difference in level between both end portions of the inclined portion is 200 µm. Each of the semiconductor chips 9 to 12 has a thickness of 200 µm. One-end portions of the metal plates 5 to 8 are connected to the semiconductor chips 9 to 12, respectively, by the Au—Ge solder 14 that serves as a first connecting material having a thickness of 2 µm. In other words, surfaces of the other-end portions of the metal plates that oppose the wiring board 1 are located substantially on the same plane as the circuit-formed surfaces of the semiconductor chips.

The semiconductor chips 9 to 12 and the other-end portions of the metal plates 5 to 8 are electrically bonded to the wiring plate 1 by the solder bumps 13 that serve as second connecting materials. The metal plates connected to the control ICs are connected to a reference potential (for example, a ground potential). The solder bumps 13 are formed of a Sn—Ag—Cu solder alloy.

The melting point of the Sn—Ag—Cu solder alloy is lower than that of the Au—Ge solder alloy that serves as the first connecting material. In the metal plates 5 to 8, the back surfaces of the one-end portions connected to the semiconductor chips 9 to 12 serve as heat radiation surfaces. The heat radiation surfaces are exposed to outside.

The heat radiation surfaces of respective metal plates 5 to 8 are arranged to be on a single imaginary plane. The imaginary plane includes a plane formed by the thermoplastic resin 3 that connects the metal plates 5 to 8 as one body. The thermoplastic resin 3 that serves as a first sealing material is formed of a thermoplastic resin material that contains polyphenylene sulfide (PPS) as its main component.

The thermoplastic resin 3 laterally retains the inclined portions of the metal plates 5 to 8. The thermoplastic resin 3 is positioned from the heat radiation surfaces of the metal plates 5 to 8 toward the semiconductor chips, in the thickness direction of the semiconductor chips. For this reason, the heat radiation surfaces are exposed. The thermoplastic resin 3 is arranged at a position which does not interfere with the semiconductor chips 9 to 12, in the thickness direction of the semiconductor chips.

The thermosetting resin 2 serving as a second sealing material is formed of a thermosetting resin that contains an epoxy resin material as its main component. The thermosetting resin material having flowability is injected into a hole portion 4 formed at a center of the thermoplastic resin 3 which is surrounded by the heat radiation surfaces of the metal plates 5 to 8 and then heated to form the thermosetting resin 2. The metal plates 5 to 8, semiconductor chips 9 to 12, solder bumps 13 and solder 14 connected electrically to the surface of the wiring board 1 are sealed to be positioned on the wiring board side from the imaginary plane including the heat radiation surfaces. In other words, the thermoplastic resin 3 is exposed to outside and the exposed surface is positioned to be lower than the heat radiation surfaces of the metal plates 5 to 8.

As described above, in the semiconductor device of the present invention, a plurality of metal plates are connected as one body by the thermoplastic resin and the connected portions of the components are sealed by the thermosetting resin. The thermoplastic resin has higher viscosity than the thermosetting resin. When joint gaps of the members inside the mold are set commonly, a very small quantity of thermoplastic resin intrudes into the gaps. In other words, when the metal plates are connected the heat radiation surfaces are prevented from being covered by the resin material. Since operations of removing an excess of the resin material can be reduced, a semiconductor chip having high heat radiation efficiency can be efficiently manufactured without damaging the semiconductor chips 9 to 12 having low resistance to stress or the connected portions thereof. On the other hand, the semiconductor chips and their connected portions are deteriorated by intrusion of an external atmosphere but, in general, it is known that the thermosetting resin has higher sealing capability than the thermoplastic resin.

Therefore, the semiconductor device having high heat radiation efficiency and high reliability can be efficiently provided by connecting the semiconductor chips to the wiring board by the metal plates that are connected integrally as one body with the first sealing material and sealing them with the second sealing material.

Figure 2A:
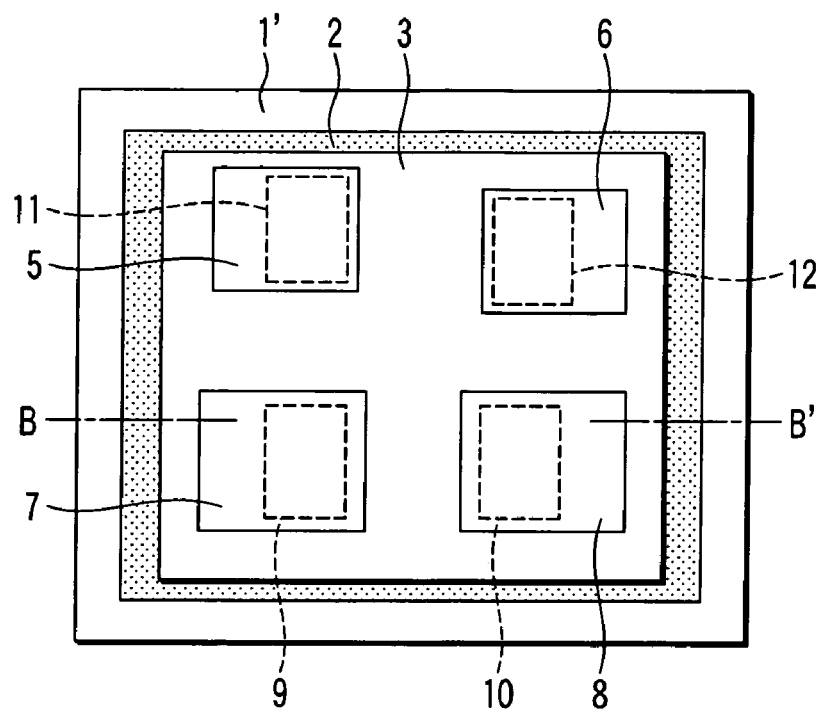
FIG. 2A is a plan view showing a semiconductor device according to a second embodiment of the present invention.
Figure 2B:
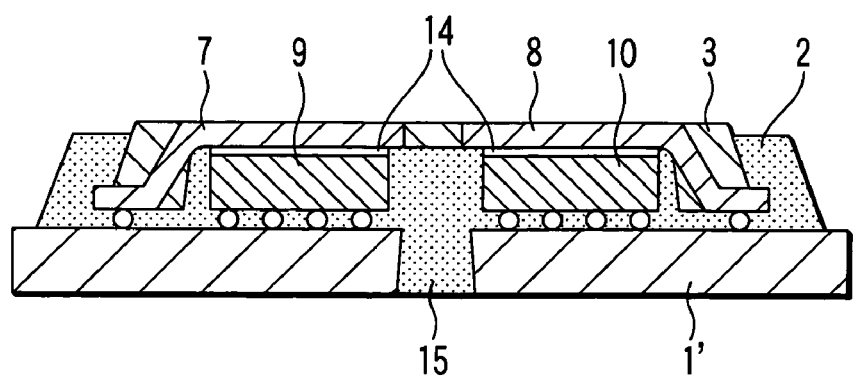
FIG. 2B is a cross-sectional view as seen along a line B-B' of FIG. 2A.

FIG. 2A is a plan view showing a semiconductor device according to a second embodiment of the present invention. FIG. 2B is a cross-sectional view as seen along a line B-B' of FIG. 2A.

Chips like or similar to those disclosed in the first embodiment are denoted by similar reference numbers and are not described in detail here.

In the semiconductor device shown in FIGS. 2A and 2B, a wiring board 1' has an supply hole portion 15 at a central portion surrounded by the semiconductor chips 9 to 12. The thermosetting resin 2 is injected through supply holes formed in the supply hole portion 15 and then solidified. The supply hole portion 15 is charged with the thermosetting resin 2.

FIGS. 3A to 3J are illustrations showing a manufacturing method of the semiconductor device of the present invention.

Steps shown in FIGS. 3A to 3J represent an example of modularizing three different kinds of semiconductor chips 32.

The sizes of the semiconductor chips 32 are 2.5 mm×2.2 mm, 2.2 mm×1.8 mm and 2.1 mm×1.8 mm. Each of the semiconductor chips 32 has a thickness of 0.25 mm.

First, a metal frame 37 on which a plurality of metal plates (heat radiating members) 34 are formed as shown in FIG. 3A is depressed to form inclined portions 34a on the metal plates 34 as shown in FIG. 3B. A copper plate having a thickness of 200 μm is used as the metal frame 37.

The width of the metal plates 34 is set in accordance with the size of the semiconductor chips 32. A distance between adjacent metal plates 34 is set at 1 mm. The dimension of the inclined portions 34a of the metal plates 34 is set to be equivalent to the dimension corresponding to the total thickness of the semiconductor chip 32 and a die bonding material (FIG. 3D) 38. A one-end portion 34b of each of the metal plate 34 is formed as a flat surface which is to be bonded to a circuit board 31 and which has a width of 300 μm. The plane formed by the one-end portion 34b of each of the metal plates 34 is included in a single imaginary plane.

The depressed metal frame 37 is put into a cavity of a mold. When the mold is closed, many parts other than the inclined portions 34a such as the end portions formed by the metal frame 37, the surfaces on which the semiconductor chips are to be mounted, their back surfaces that function as heat radiation surfaces and the like are arranged to be in close contact with the inner wall surface of the cavity. At this time, a plurality of surface portions of the metal frame 37 that function as heat radiation surfaces are arranged to be in close contact with the flat portion of the cavity such that they are in a common plane.

A thermoplastic resin material 39 that serves as a first sealing material is injected into the cavity formed by closing the mold. The cavity is a hollow formed to connect a plurality of inclined portions 34a provided on the metal frame 37. After that, the thermoplastic resin 39 is cooled and cured, such that a cap K having the metal plates 34 connected integrally as one body is formed as shown in FIG. 3C. The formed cap K has a length of 8 mm.

The metal plates 34 are sealed in a state that the surfaces on which the semiconductor chips 32 are die-bonded, the surfaces which are connected to a circuit board 31 and surfaces opposing the surfaces on which the semiconductor chips 32 are die-bonded, are exposed to outside.

After the cap K is formed by sealing the metal plates 34, resin flash is removed by sandblasting and the exposed surfaces of the metal plates 34 are cleaned with an Ar ion gun. Then, semiconductor chips are die-bonded on the respective portions of plural metal plates 34 that are exposed to the inside space of the thermoplastic rein 39 as shown in FIG. 3D. The processing temperature is 360° C.

The mounting position of the semiconductor chip 32 which is to be first die-bonded is recognized in accordance with the metal frame 37. The die bonding material 38 serving as a first bonding material is a AuSn eutectic solder having a melting point of 280° C., which is preliminarily supplied to the back surface of the semiconductor 32 by evaporation. As for the die bonding material 38, SnPb solder, AuGe solder and the like may also be used.

Next, a second semiconductor chip 32 is die-bonded on the cap K. The mounting position of the second die-bonded semiconductor chip 32 is recognized in accordance with the first die-bonded semiconductor chip 32. The reason is that when the electrodes 40 of the semiconductor chips 32 are bonded by soldering to electrodes 41 of the circuit board 31 in subsequent steps positions of the electrodes of the kinds of semiconductor chips 32 can be fitted to the electrodes 41 of the circuit board 31 with high accuracy.

After that, a third semiconductor chip 32 is die-bonded. The mounting position of the third die-bonded semiconductor chip 32 is recognized in accordance with the first die-bonded semiconductor chip 32 and the second die-bonded semiconductor chip 32. The reason is the same as that explained above.

After the semiconductor chips 32 are die-bonded, the cap K is cut and separated from the metal frame 37 as shown in FIG. 3E. After that, solder paste 33 that serves as a second bonding material is supplied to the board electrodes 41 of the circuit board 31 as shown in FIG. 3F. The circuit board 31 used at this time is a glass epoxy substrate which has a size of 10 mm×10 mm and a thickness of 0.8 mm. As for the board electrodes 41, prefluxed copper is used.

As for the bonding pad, a pad having its surface subjected to gold plating or silver plating may be used. As for the soldering member, Sn-3Ag-0.5Cu is used. Sn—Zn solder, Sn—Bi solder or the like may be used as the soldering member. However, the melting point of the soldering member should be lower than that of the die bonding material 38.

Figure 3G:
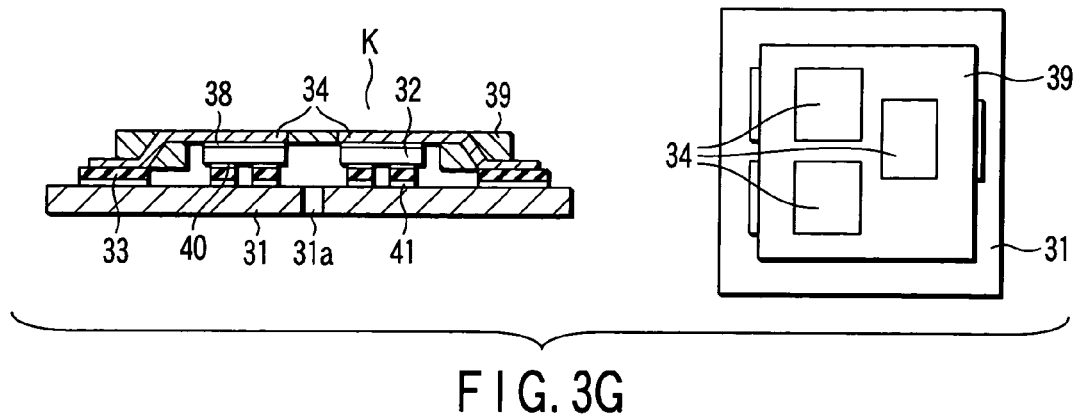
FIG. 3G is illustrations showing the manufacturing step of the semiconductor device of the present invention.

After the solder paste 33 is supplied to the board electrodes 41, the cap K on which the semiconductor chips 32 are die-bonded is mounted on the circuit board 31 as shown in FIG. 3G. At this time, the cap K is recognized in accordance with the semiconductor chips 32 die-bonded on the cap K. The positions of the electrodes 40 of the semiconductor chips 32 are fitted to the board electrodes 41 with good accuracy.

Figure 3H:
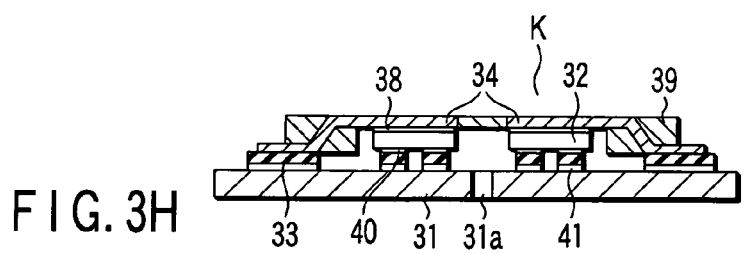
FIG. 3H is an illustration showing the manufacturing step of the semiconductor device of the present invention.

After the cap K is mounted on the circuit board 31, the circuit board 31 is passed through a reflow furnace to connect solder bonding as shown in FIG. 3H. An example of a heating temperature of the reflow furnace is a profile of raising the room temperature to 150° C. for one hundred seconds at a constant speed, then raising the temperature from 150° C. to 180° C. for 75 seconds at a constant speed and finally raising the temperature up to the peak temperature of 240° C. for forty seconds at a constant speed and cooling as shown in FIG. 4.

The peak heating temperature is lower than the melting point of the die bonding material 38. Peeling of the back surfaces of the semiconductor chips 32 and the metal plates 34 caused by remelting of the die bonding material 38, and mixture of air bubbles into the die bonding portions are thereby prevented. After reflow, flux residues are cleaned. For example, if the module is immersed in a commercially available flux cleaner and ultrasonic waves of 45 kHz are applied for three minutes, flux residues are cleaned.

Figure 3I:
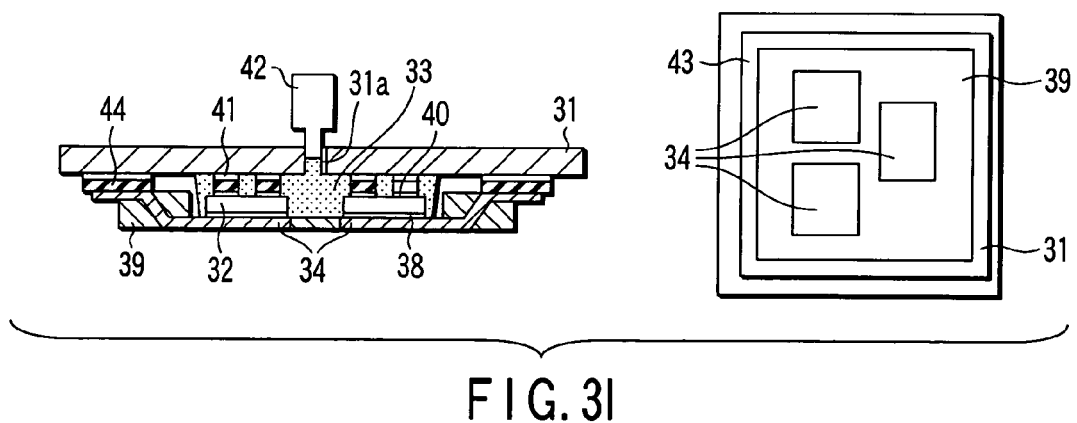
FIG. 3I is illustrations showing the manufacturing step of the semiconductor device of the present invention.

After cleaning flux residues, thermosetting resin 43 serving as a second sealing material is charged between the semiconductor chips 32 and the circuit board 31 and between the cap K and the circuit board 31. Supplying the thermosetting resin 43 is conducted by dispensing the thermosetting resin 43 in a state that a needle 42 is inserted into a supply hole portion 31a of the circuit board 31 which is opened at a position corresponding to the center of the cap K mounted on the circuit board 31 as shown in FIG. 3I. The supply hole portion 31a may be set at the other position if it is in an area where the cap K is arranged. The number of the supply hole portion 31a may be plural.

To improve permeability of the thermosetting resin 43, the circuit board 31 (hereinafter called semiconductor device) on which the cap K is soldered is heated at 70° C. when the resin is charged. As for the resin, a commercially available epoxy-based thermosetting resin is applied. The resin contains the following main components: 10 to 20% of bisphenol-A-type epoxy resin, 10 to 20% of alicyclic epoxy resin, 10 to 20% of biphenyl-type epoxy resin, 25 to 35% of acid anhydride, 10 to 30% of silicon dioxide, and 1% or less of carbon black.

The thermosetting resin 43 may be a phenol-based resin or the like. The resin may be supplied by dispensing the resin through a hole formed at the cap K.

Figure 3J:
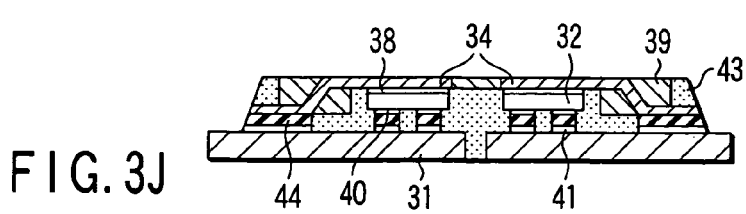
FIG. 3J is an illustration showing the manufacturing step of the semiconductor device of the present invention.
Figure 5:
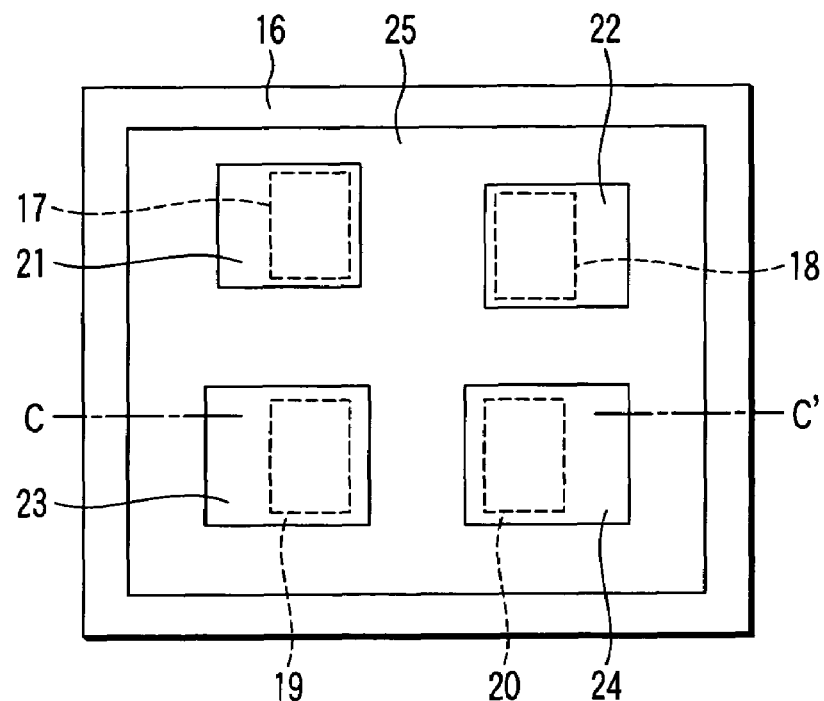
FIG. 5 is a plan view showing a conventional semiconductor device.
Figure 6:
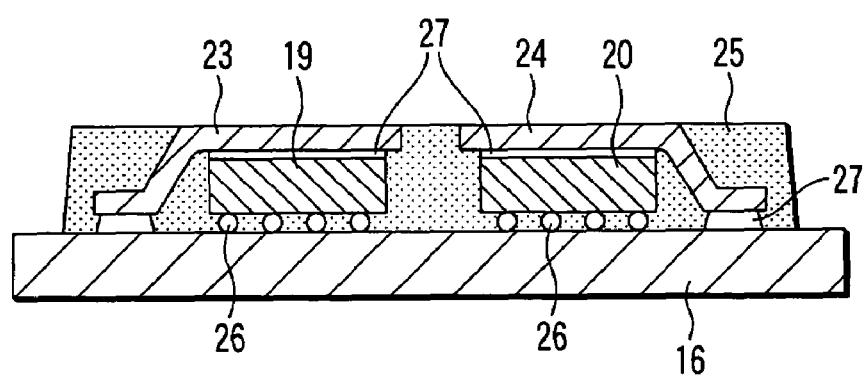
FIG. 6 is a cross-sectional view as seen along a line C-C' of FIG. 5.

Finally, to cure the thermosetting resin 43, the semiconductor device is processed in the oven as shown in FIG. 3J. The curing condition of the thermosetting resin 43 is curing at 150° C. for approximately 90 minutes. As for sealing the resin, the semiconductor device may be put into the mold and a molding material may be charged therein.

The present invention can be modified otherwise in various manners without departing from the spirit and scope of the invention.

According to the embodiment of the manufacturing method of the present invention, the cap having the heat radiation surface is formed by connecting the metal plates as one body with the first sealing material, the semiconductor chips are die-bonded on the cap, the cap having the die-bonded semiconductor chips is bonded to the wiring board by flip chip bonding, and the cap and semiconductor chips are sealed. Thus, arranging the heat radiation surfaces of the metal plates in a common imaginary plane can be facilitated and flattening the heat radiation surface of the semiconductor device can be easily implemented.

Irregularity in the dimensions of the members may cause the distances between the electrodes and the wiring board to vary on the surface opposing the wiring board. However, irregularity in thickness can be solved later in accordance with quantity of the conductive connection material such as the solder paste and the like. For this reason, the present invention can easily provide the semiconductor device capable of improving the heat radiation efficiency by allowing the heat radiation surface to be in close contact with the other large heat radiating member.

According to the present invention, as explained above, the surface opposing the surface bonded to the semiconductor chip, at the one-end portion of each of the heat radiating members, can hardly be covered by the sealing material and the removal of the sealing material can be operated simply. The semiconductor device having high heat radiation characteristic can be therefore manufactured without damaging the flip chip bonding portion of the semiconductor chips having small resistance to stress.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a plurality of semiconductor chips each having a first surface bonded to a wiring board and being electrically connected thereto;
   a plurality of heat radiating members each having a first end portion bonded to a second surface of each of the plurality of semiconductor chips and having second end portion bonded to the wiring board through solder bumps formed thereon for establishing an electric connection therebetween;

a first sealing material which seals the plurality of heat radiating members integrally as one body, such that a surface of the heat radiating members which opposes the surface bonded to the semiconductor chip is externally exposed; and a second sealing material which seals an outer peripheral portion of the first sealing material, and the semiconductor chips.

2. The semiconductor device according to claim 1, wherein the first sealing material is thermoplastic resin and the second sealing material is thermosetting resin.

3. A method of manufacturing a semiconductor device, comprising:

forming a cap by sealing a plurality of heat radiating members integrally as one body with a first sealing material, such that a first surface portion of each of the plurality of heat radiating members is externally exposed;

mounting semiconductor chips on second surface portions of the plurality of heat radiating members, respectively;

bonding the mounted semiconductor chips and end portions of the heat radiating members to a wiring board through solder bumps formed on the semiconductor chips and the end portions of the heat radiating members; and sealing the semiconductor chips bonded to the wiring board, and an outer peripheral portion of the first sealing material with a second sealing material.

4. The method according to claim 3, wherein the plurality of heat radiating members are formed in a metal frame, and after the heat radiating members are sealed with the first sealing material and the semiconductor chips are mounted on the metal frame, the heat radiating members are cut from the metal frame.

5. The method according to claim 3, wherein a first of the semiconductor chips to be mounted on the heat radiating member is positioned and mounted by recognizing the heat radiating members, and a semiconductor chip to be next mounted is positioned by recognizing the mounted semiconductor chip.

6. The method according to claim 3, wherein the cap is positioned on the wiring board in accordance with recognition of the position of the semiconductor chip mounted on the heat radiating member.

7. The method according to claim 3, wherein the second surface portions of the heat radiating members and the semiconductor chips are bonded with a first bonding material, the end portions of the heat radiating members and the wiring board are bonded with a second bonding material, the semiconductor chips and the wiring board are bonded with the second bonding material, and a melting point of the second bonding material is lower than a melting point of the first bonding material.

8. The method according to claim 7, wherein the cap is bonded to the wiring board by heating and a peak temperature at the heating is lower than the melting point of the first bonding material.

9. The method according to claim 7, wherein the second sealing material is supplied and charged through at least one of a plurality of supply holes provided at the wiring board or at least one of a plurality of supply holes provided at the cap.

* * * * *